(12) United States Patent
Takahashi et al.

(10) Patent No.: US 10,790,326 B2
(45) Date of Patent: Sep. 29, 2020

(54) PIXEL DEVICE ON DEEP TRENCH ISOLATION (DTI) STRUCTURE FOR IMAGE SENSOR

(71) Applicant: Taiwan Semiconductor Manufacturing Co., Ltd., Hsin-Chu (TW)

(72) Inventors: Seiji Takahashi, Hsinchu (TW); Jhy-Jyi Sze, Hsin-Chu (TW); Tzu-Hsiang Chen, Xihu Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/194,663

(22) Filed: Nov. 19, 2018

(65) Prior Publication Data
US 2020/0098798 A1 Mar. 26, 2020

Related U.S. Application Data

(60) Provisional application No. 62/736,678, filed on Sep. 26, 2018.

(51) Int. Cl.
*H01L 27/146* (2006.01)
*H01L 27/148* (2006.01)
*H01L 29/768* (2006.01)
*H01L 21/02* (2006.01)

(52) U.S. Cl.
CPC ...... *H01L 27/1463* (2013.01); *H01L 21/0262* (2013.01); *H01L 21/02639* (2013.01); *H01L 27/1464* (2013.01); *H01L 27/14603* (2013.01); *H01L 27/14689* (2013.01)

(58) Field of Classification Search
CPC .................................................. H01L 27/1463
See application file for complete search history.

(56) References Cited

U.S. PATENT DOCUMENTS

| | | | |
|---|---|---|---|
| 8,120,062 B2 | 2/2012 | Kim | |
| 10,658,410 B2 * | 5/2020 | Cheng | H01L 27/14634 |
| 2011/0183709 A1 | 7/2011 | Roy | |
| 2012/0086845 A1 | 4/2012 | Enomoto et al. | |
| 2012/0248560 A1 * | 10/2012 | Lee | H01L 27/14627 257/432 |

(Continued)

*Primary Examiner* — Moazzam Hossain
(74) *Attorney, Agent, or Firm* — Eschweiler & Potashnik, LLC

(57) ABSTRACT

The present disclosure relates to a CMOS image sensor having a pixel device on a deep trench isolation (DTI) structure, and an associated method of formation. In some embodiments, a deep trench isolation (DTI) structure is disposed at a peripheral of a pixel region, extending from a back-side of the substrate to a position within the substrate. A pixel device is disposed at the front-side of the substrate directly overlying the DTI structure. The pixel device comprises a pair of source/drain (S/D) regions disposed within the substrate and reaching on a top surface of the DTI structure. By forming the disclosed pixel device directly overlying the DTI structure to form a SOI device structure, short channel effect is reduced because of the room for pixel device and also because the insulation layer underneath the pixel device. Thus higher device performance can be realized.

20 Claims, 15 Drawing Sheets

(56) References Cited

U.S. PATENT DOCUMENTS

| | | | |
|---|---|---|---|
| 2014/0016012 A1* | 1/2014 | Oishi | H04N 5/372 |
| | | | 348/311 |
| 2014/0218578 A1* | 8/2014 | Kohyama | H04N 5/37457 |
| | | | 348/308 |
| 2015/0123178 A1 | 5/2015 | Nishida et al. | |
| 2015/0228684 A1* | 8/2015 | Yamashita | H01L 27/14643 |
| | | | 257/292 |
| 2016/0225812 A1 | 8/2016 | Elkhatib et al. | |
| 2017/0271383 A1 | 9/2017 | Lai et al. | |
| 2018/0151759 A1* | 5/2018 | Huang | H01L 27/14603 |
| 2018/0350856 A1* | 12/2018 | Masagaki | H01L 27/14621 |

* cited by examiner

PIXEL DEVICE ON DEEP TRENCH ISOLATION (DTI) STRUCTURE FOR IMAGE SENSOR

REFERENCE TO RELATED APPLICATION

This Application claims priority to U.S. Provisional Application No. 62/736,678, filed on Sep. 26, 2018, the contents of which are hereby incorporated by reference in their entirety.

BACKGROUND

Digital cameras and optical imaging devices employ image sensors. Image sensors convert optical images to digital data that may be represented as digital images. An image sensor includes a pixel array (or grid) for detecting light and recording intensity (brightness) of the detected light. The pixel array responds to the light by accumulating a charge. The accumulated charge is then used (for example, by other circuitry) to provide a color and brightness signal for use in a suitable application, such as a digital camera.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
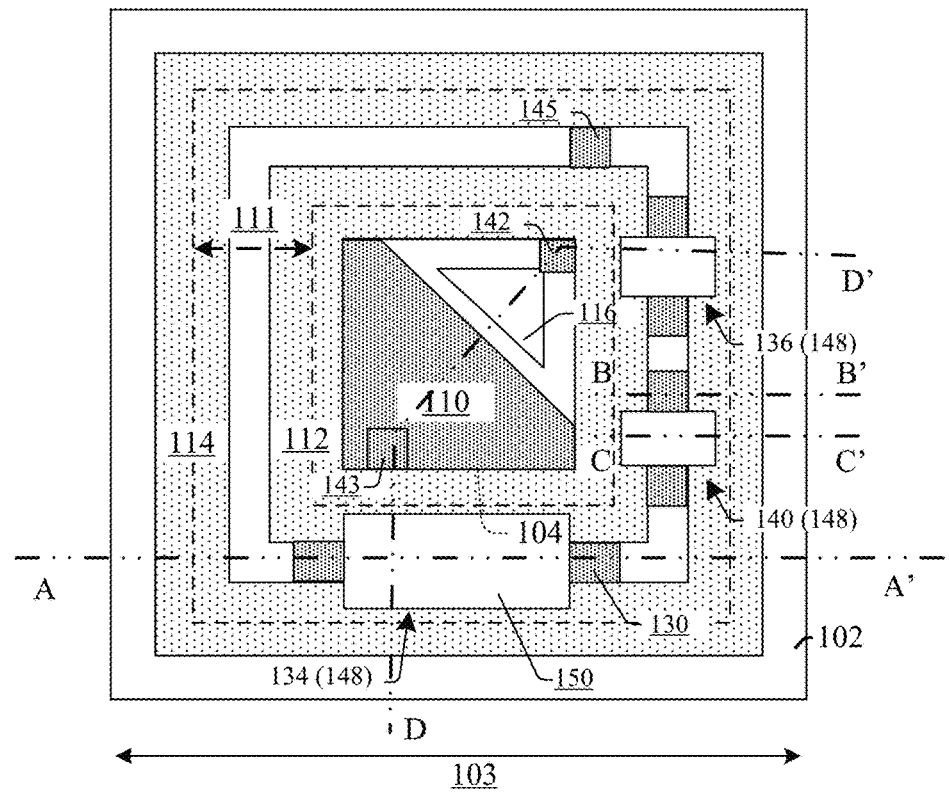
FIG. 1 illustrates a top view of some embodiments of a CMOS (complementary metal-oxide-semiconductor) image sensor having a pixel device on a deep trench isolation (DTI) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For image sensors with a pixel array, dielectric trenches are fabricated as isolation structures to isolate image sensor pixels and improve electrical and optical isolation between neighboring pixels and reduce blooming and crosstalk. Pixel devices are commonly arranged within the pixel region inside boundary isolation structures. Integrated circuit (IC) technologies are frequently being improved by scaling down device geometries to achieve lower fabrication costs, higher device integration density, higher speeds, and better performance. However, due to device scaling, sensing pixels of the image sensor have smaller dimensions and are closer to one another, and thus room for pixel devices is more limited. A pixel device with smaller gate length may have degraded performance, such as serious short channel effect and noise level.

The present disclosure relates to a CMOS image sensor comprising a pixel device overlying a deep trench isolation (DTI) structure, and an associated method of formation. In some embodiments, the CMOS image sensor has a pixel region disposed within a substrate. The pixel region has a P-N junction photodiode configured to convert radiation into an electric signal. A deep trench isolation (DTI) structure disposed in the pixel region of the substrate, extending from a back-side of the substrate to a position within the substrate. A pixel device is disposed at the front-side of the substrate directly overlying the DTI structure. The pixel device comprises a gate electrode disposed over the substrate and a pair of source/drain (S/D) regions disposed within the substrate and reaching on a top surface of the DTI structure. Comparing to a previous approach where the pixel device could be arranged inside an area surrounded by an isolation structure, the room for pixel device is enlarged, and thus a larger pixel device can be arranged in the sensing pixel, thus short channel effect and noise level can be improved. Also, the pixel device is arranged directly on the DTI structure, such that an SOI (substrate on insulator) device structure is realized. With the DIT structure acting as the insulator underneath the pixel device, short channel effect can be further improved, power consumption can be further lowered, and the noise level can be further improved as benefits of the SOI device.

FIG. 1 illustrates a top view of a sensing pixel 103 of a CMOS image sensor 100. The term "pixel" refers to a unit cell containing features (for example, a photodetector and various circuitries, which may include various semiconductor devices) for converting electromagnetic radiation to an electrical signal. In the depicted embodiment, each pixel may include a photodetector, such as a photogate-type photodetector, for recording an intensity or brightness of light (radiation). Each pixel may also include various semiconductor devices, such as various transistors including a transfer transistor, a reset transistor, a source-follower transistor, a select transistor, another suitable transistor, or combinations thereof. Additional circuitry, input, and/or output may be coupled to the pixel array to provide an operating environment for the pixels and support external communications with the pixels. For example, the pixel array may be coupled with readout circuitry and/or control circuitry. As an example, the sensing pixel 103 may have a size in a range of from about 0.5 µm to about 10 µm. If not stated otherwise, the dimension examples hereafter are all based on such a pixel size.

In some embodiments, the sensing pixel 103 comprises a P-N junction photodiode doping column 110 disposed within a substrate 102. A floating diffusion well 142 is disposed within the substrate 102 aside of the P-N junction photodiode doping column 110. A transfer gate electrode 116 is disposed overlying the substrate 102 between the floating diffusion well 142 and the P-N junction photodiode doping column 110. The P-N junction photodiode doping column 110 and the substrate 102 are in contact with each other to form a P-N junction photodiode 104 (Also see FIG. 5). In some embodiments, a photodiode surrounding well node 143 is disposed on an upper portion of the P-N junction photodiode doping column 110 opposite to the floating diffusion well 142. At a peripheral region of the sensing pixel 103, a first shallow trench isolation (STI) structure 112 is disposed surrounding the P-N junction photodiode doping column 110 and the floating diffusion well 142. A second STI structure 114 is disposed at outer peripheral of the first STI structure 112. A pixel device 148 is disposed between the first STI structure 112 and the second STI structure 114. The pixel device 148 may be a source follower transistor 134, a reset transistor 136, or a row select transistor 140, and may respectively comprise a gate electrode 150 disposed over the substrate 102 and a pair of source/drain (S/D) regions 130 disposed within the substrate 102. The pixel device 148 may have innermost sidewalls of the S/D regions 130 contacting an outermost sidewall of the first STI structure 112 and outermost sidewalls of the S/D regions 130 contacting innermost sidewall of the second STI structure 114. In some embodiments, a pixel device well node 145 is disposed between the first STI structure 112 and the second STI structure 114. The pixel device well node 145 may contact the outermost sidewall of the first STI structure 112 and the innermost sidewall of the second STI structure 114. A deep trench isolation (DTI) structure 111 is disposed between the first STI structure 112 and the second STI structure 114 directly under the pixel device 148. As an example, the first STI structure 112 and the second STI structure 114 may respectively have a width in a range of from about 50 nm to about 200 nm. The DTI structure 111 may have a width in a range of from about 100 nm to about 500 nm. In some embodiments, the DTI structure 111 or the STI structures 112, 114 may comprise oxide, nitride, high-k dielectric material such as aluminum oxide (AlO), tantalum oxide (TaO), hafnium oxide (HfO), hafnium silicon oxide (HfSiO), hafnium aluminum oxide (HfAlO), or hafnium tantalum oxide (HfTaO), or the combination thereof, for example.

Figure 2:
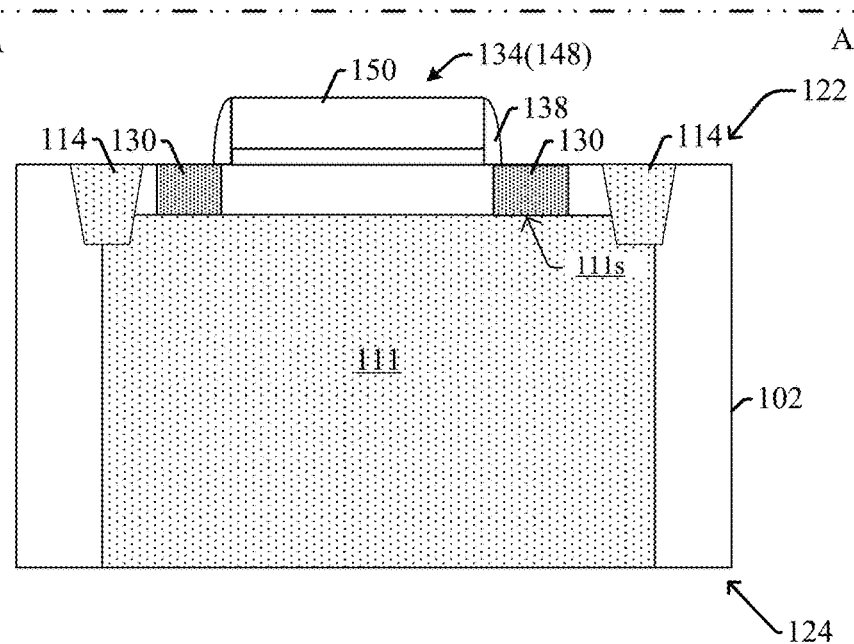
FIG. 2 illustrates a cross-sectional view (e.g. along line A-A' of FIG. 1) of some embodiments of a CMOS image sensor having a pixel device on a DTI structure.

FIG. 2 illustrates a cross-sectional view 200 of some embodiments of a CMOS image sensor having a pixel device 148 disposed on a deep trench isolation (DTI) structure 111. FIG. 2 is described as a cross-sectional view along a line B-B' of FIG. 1, but it is appreciated that some features shown in FIG. 2 can also be independent and thus is not limited by the features shown in FIG. 1. As shown in FIG. 2, the CMOS image sensor comprises a substrate 102 having a front-side 122 and a back-side 124. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. As an example, the substrate 102 may have a depth in a range of from about 2 µm to about 10 µm. The substrate 102 comprises a pixel region that may be arranged within the substrate 102 in an array comprising rows and/or columns, such as sensing pixel 103 shown in FIG. 1. A deep trench isolation (DTI) structure 111 is disposed in the substrate 102, extending from the back-side 124 to a position within the substrate 102. The DTI structure 111 is disposed between STI structures 112 and 114. As shown in FIG. 1, in some embodiments, the STI structures 112 and 114 on opposing sides of the DTI structure 111 can be continuous rectangular shaped rings. As an example, the STI structures 112 and 114 may respectively have a depth in a range of from about 50 nm to about 500 nm. The DTI structure 111 may have a depth in a range of from about 2 µm to about 10 µm. In some embodiments, the DTI structure 111 comprises a dielectric fill layer (e.g., an oxide layer). The pixel device 148 is disposed at the front-side 122 of the substrate 102 directly overlying the DTI structure 111. The pixel device 148 comprises a gate electrode 150 disposed over the substrate 102 and a pair of source/drain (S/D) regions 130 disposed within the substrate 102. In some embodiments, the S/D regions 130 reach on a top surface 111s of the DTI structure 111.

Figure 3A:
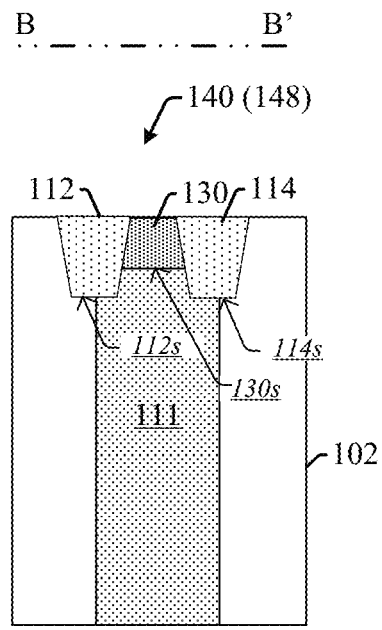
FIG. 3A illustrates a cross-sectional view (e.g. along line B-B' of FIG. 1) of some embodiments of a CMOS image sensor comprising a pixel device on a DTI structure.
Figure 4A:
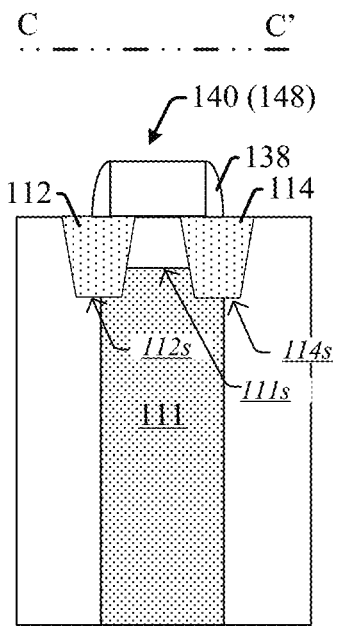
FIG. 4A illustrates a cross-sectional view (e.g. along line C-C' of FIG. 1) of some embodiments of a CMOS image sensor comprising a pixel device on a DTI structure.
Figure 3B:
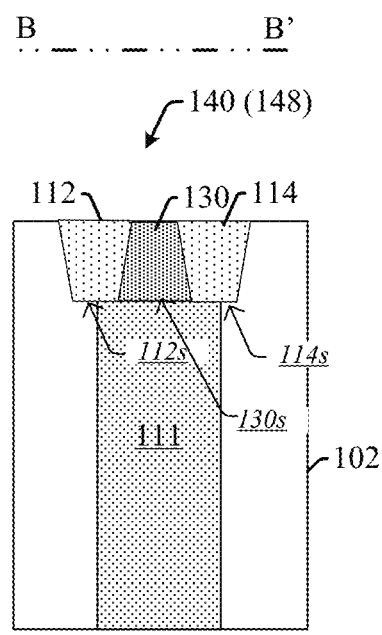
FIG. 3B illustrates a cross-sectional view (e.g. along line B-B' of FIG. 1) of some alternative embodiments of a CMOS image sensor comprising a pixel device on a DTI structure.
Figure 4B:
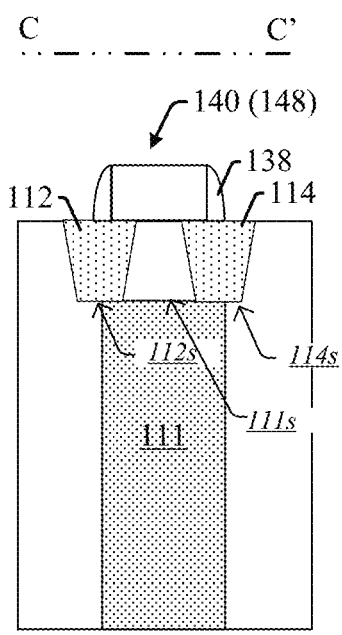
FIG. 4B illustrates a cross-sectional view (e.g. along line C-C' of FIG. 1) of some alternative embodiments of a CMOS image sensor comprising a pixel device on a DTI structure.

FIG. 3A and FIG. 4A illustrate cross-sectional views 300a, 400a of some embodiments of a CMOS image sensor comprising a pixel device on a DTI structure. As an example, cross-sectional view 300a of FIG. 3A can be along a line B-B' shown in FIG. 1, and cross-sectional view 400a of FIG. 4A can be along a line C-C' shown in FIG. 1. As shown in FIG. 3A and FIG. 4A, in some embodiments, the CMOS image sensor may comprise S/D regions 130 of the pixel device 148 disposed between the first STI structure 112 and the second STI structure 114 and directly on the DTI structure 111. The S/D regions 130 of the pixel device 148 may have bottom surfaces 130s locating at a position of the substrate 102 higher than a bottom surface 112s of the first STI structure 112 and a bottom surface 114s of the second STI structure 114. FIG. 3B and FIG. 4B illustrate cross-sectional views 300b, 400b of some alternative embodiments of a CMOS image sensor shown in FIG. 3A and FIG. 4A. As an example, cross-sectional view 300b of FIG. 3B can be along a line B-B' shown in FIG. 1, and cross-sectional view 400b of FIG. 4B can be along a line C-C' shown in FIG. 1. As shown in FIG. 3B and FIG. 4B, in some embodiments, the CMOS image sensor may comprise S/D regions 130 of the pixel device 148 disposed between the first STI structure 112 and the second STI structure 114. The S/D regions 130 of the pixel device 148 may have bottom surfaces 130s laterally aligned with a bottom surface 112s of the first STI structure 112, a bottom surface 114s of the second STI structure 114, and/or a top surface 111s of the DTI structure 111.

Figure 5:
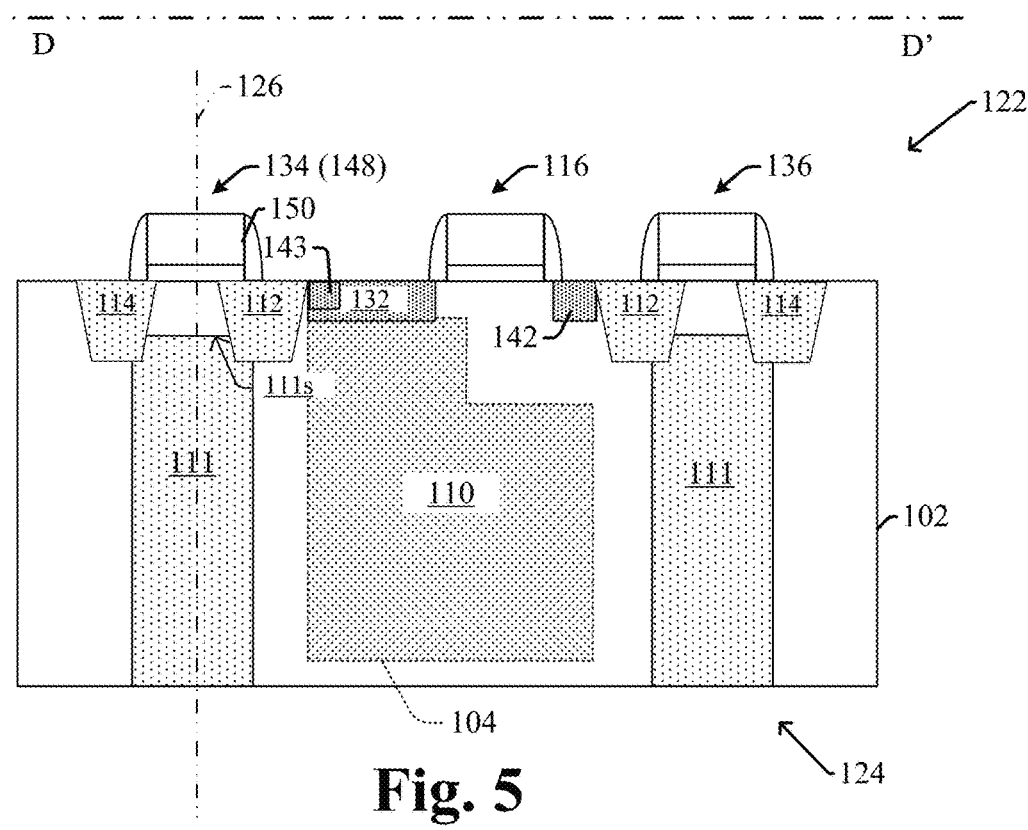
FIG. 5 illustrates a cross-sectional view (e.g. along line D-D' of FIG. 1) of some embodiments of a CMOS image sensor comprising a pixel device on a DTI structure.

FIG. 5 illustrates a cross-sectional view (e.g. along line D-D' of FIG. 1) of some embodiments of a CMOS image sensor comprising a pixel device on a DTI structure. As shown by FIG. 5, the sensing pixel 103 comprises a P-N junction photodiode doping column 110 disposed within the substrate 102. In some embodiments, the substrate 102 has a second doping type (e.g., n-type doping) that is different than a first doping type (e.g., p-type doping) of the P-N junction photodiode doping column 110 and contacts the P-N junction photodiode doping column 110 to form a P-N junction photodiode 104 configured to convert radiation that enters the substrate from the back-side into an electrical signal. The substrate 102 may be regionally doped to form a P-N junction photodiode doping well at the contact region to the P-N junction photodiode doping column 110. For example, the P-N junction photodiode doping well may have a doping concentration in a range of from about $10^{14}/cm^3$ to about $10^{18}/cm^3$, whereas the epitaxial doping concentration for other region of the substrate 102 may be in a range of from about $10^{13}/cm^3$ to about $10^{15}/cm^3$. The P-N junction photodiode doping column 110 may have a doping concentration in a range of from about $10^{14}/cm^3$ to about $10^{18}/cm^3$. A pinning doped layer 132 may be disposed on the P-N junction photodiode doping column 110. The pinning doped layer 132 extends along the front-side 122 of the substrate 102. The pinning doped layer 132 may contact a lateral surface of the P-N junction photodiode doping column 110 and functions as a pinned implant layer for the P-N junction photodiode doping column 110. The pinning doped layer 132 may be heavily doped (e.g. having a resistivity down in the range of milliOhm/cm). In some embodiments, a photodiode surrounding well node 143 from the front side 122 of the substrate 102 may be disposed within the pinning doped layer 132 or the P-N junction photodiode doping column 110. The photodiode surrounding well node 143 may be heavily doped and may have a doping concentration in a range of from about $10^{15}/cm^3$ to about $10^{18}/cm^3$.

In some embodiments, a floating diffusion well 142 is disposed from the front-side 122 of the substrate 102 to a position within the substrate 102. A transfer gate electrode 116 is arranged on the front-side 122 of the substrate 102 at a position laterally between the P-N junction photodiode 104 and the floating diffusion well 142. During the operation, the transfer gate electrode 116 controls charge transfer from the P-N junction photodiode 104 to the floating diffusion well 142. If the charge level is sufficiently high within the floating diffusion well 142, a source follower transistor 134 is activated and charges are selectively output according to operation of a row select transistor (referring to FIG. 1) used for addressing. A reset transistor 136 can be used to reset the P-N junction photodiode 104 between exposure periods. An example circuit diagram of the image sensing pixel can be referred to FIG. 7 and associating discussion below.

The DTI structure 111 is disposed at a peripheral region of the P-N junction photodiode 104, extending from the back-side 124 of the substrate 102 to a position within the substrate 102. A first shallow trench isolation (STI) structure 112 is disposed from a front-side 122 of the substrate 102 at an inner peripheral of the DTI structure 111. A second STI structure 114 is disposed from the front-side 122 at an outer peripheral of the DTI structure 111. The DTI structure 112 and the STI structure 114 collectively function as isolations for the sensing pixel 103, such that crosstalk and blooming among the sensing pixel 103 can be reduced.

A pixel device 148 is disposed at the front-side 122 of the substrate 102 directly overlying the DTI structure 111. The pixel device 148 comprises a gate electrode 150 disposed over the substrate 102 and a pair of source/drain (S/D) regions 130 disposed within the substrate 102. The pixel device 148 is disposed between the first STI structure 112 and the second STI structure 114. In some embodiments, the gate electrode 150 of the pixel device 148 is vertically aligned with the DTI structure 111 (e.g. sharing a common center line 126).

Figure 22:
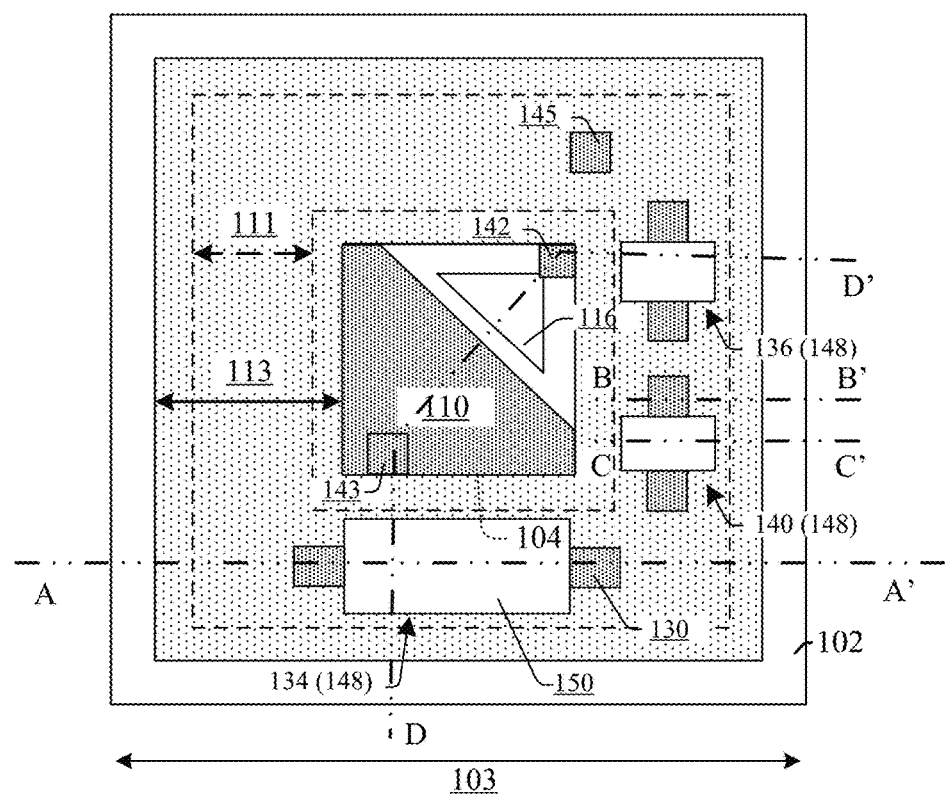
FIG. 22 illustrates a top view of some alternative embodiments of a CMOS (complementary metal-oxide-semiconductor) image sensor having a pixel device on a trench isolation structure.
Figure 23:
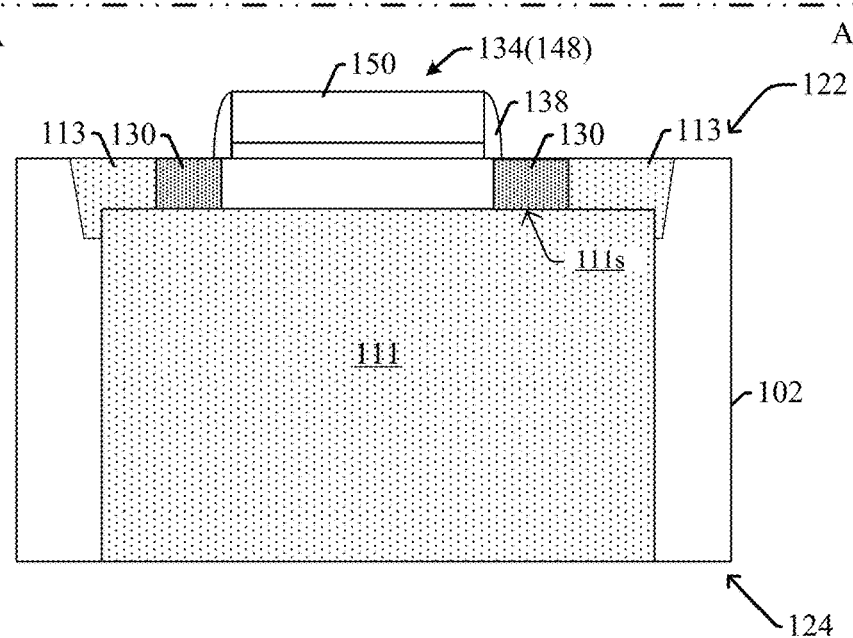
FIG. 23 illustrates a cross-sectional view (e.g. along line A-A' of FIG. 22) of some alternative embodiments of a CMOS image sensor having a pixel device on a trech isolation structure.

FIG. 22 and FIG. 23 respectively illustrates a top view and a cross-sectional view of a sensing pixel 103 of a CMOS image sensor 2200 according to some embodiments alternative to the embodiments shown in FIGS. 1-5. The CMOS image sensor 2200 may have features similar to the CMOS image sensor 100 shown in FIGS. 1-5 except that a continuous trench isolation structure 113 may be disposed overlying a first trench isolation structure (e.g. a deep trench isolation (DTI) structure 111 shown in the figures), replacing the first STI structure 112 and the second STI structure 114, at a peripheral region of the sensing pixel 103. The pixel device 148 may be disposed within an opening at an upper portion of the continuous trench isolation structure 113. In some embodiments, the opening has the same size as the pixel device 148. The pixel device 148 may have sidewalls contacting sidewall of the continuous trench isolation structure 113. The deep trench isolation (DTI) structure 111 is disposed underneath the continuous trench isolation structure 113 directly under the pixel device 148. As an example, the continuous trench isolation structure 113 may have a width in a range of from about 100 nm to about 500 nm. FIG. 23 may illustrate the cross-sectional view 200 along a line A-A' of FIG. 22. The cross-sectional views along other directions, such as lines B-B', C-C', D-D' can be reasonably referred to FIGS. 3A-5 with the first STI structure 112 and the second STI structure 114 replaced by the continuous trench isolation structure 113. It is appreciated that some features shown in FIG. 23 can also be independent and thus is not limited by the features shown in FIG. 22. It is also appreciated that embodiments described below can be incorporated with features shown in FIGS. 22-23.

Figure 6A:
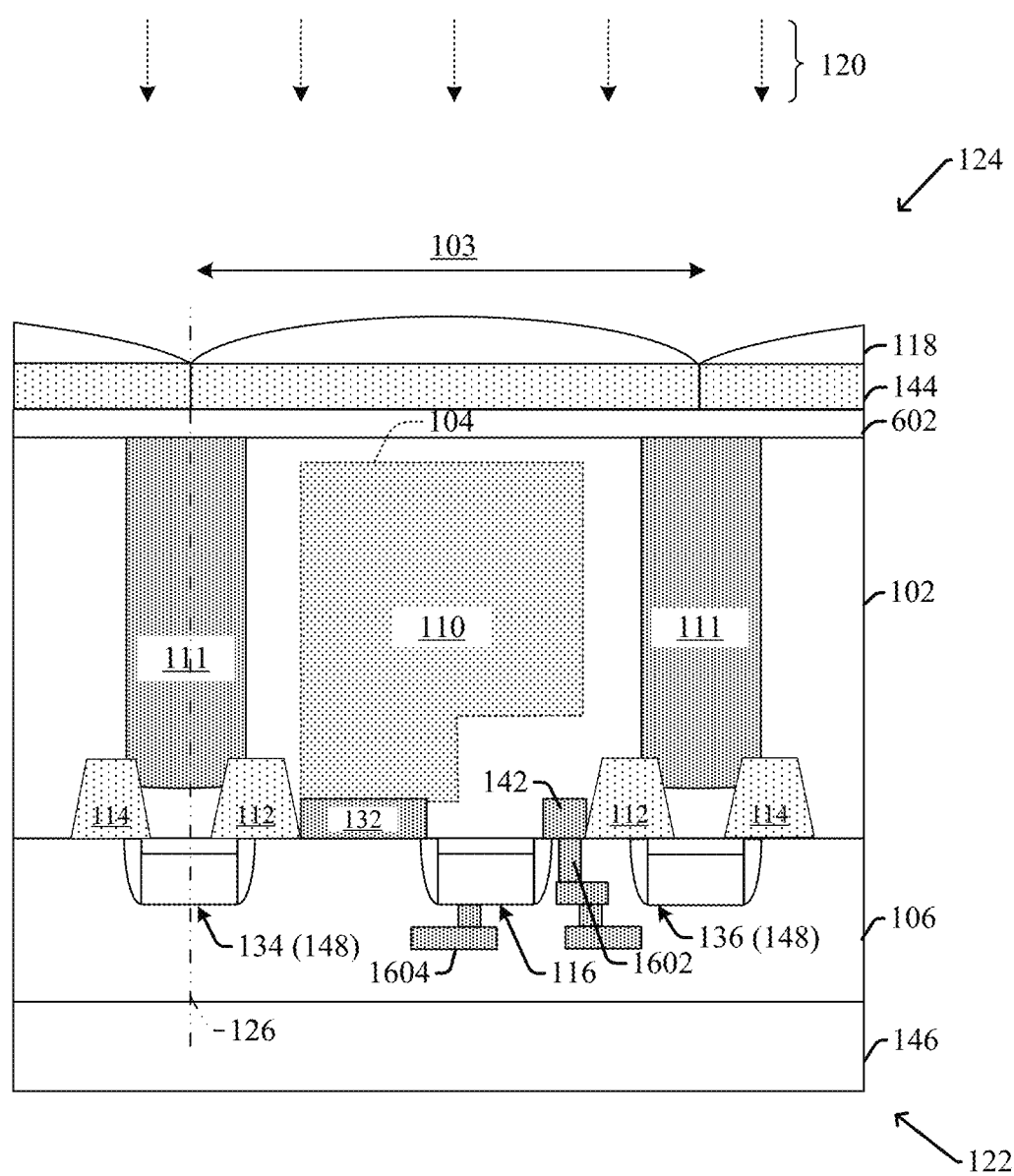
FIG. 6A illustrates a cross-sectional view of some embodiments of an integrated chip comprising an image sensor having a pixel device on a DTI structure.

As shown in FIG. 6A, in some embodiments, a plurality of color filters 144 are arranged over the back-side 124 of the substrate 102. The plurality of color filters 144 are respectively configured to transmit specific wavelengths of incident radiation or incident light 120. For example, a first color filter (e.g., a red color filter) may transmit light having wavelengths within a first range, while a second color filter may transmit light having wavelengths within a second range different than the first range. In some embodiments, the plurality of color filters 144 may be arranged within a grid structure overlying the substrate 102. In some embodiments, the grid structure may comprise a dielectric material. In some embodiments, an anti-reflection layer 602 is disposed between the color filters 144 and the substrate 102. In some embodiments, the anti-reflection layer 602 may comprise oxide, nitride, high-k dielectric material such as aluminum oxide (AlO), tantalum oxide (TaO), hafnium oxide (HfO), hafnium silicon oxide (HfSiO), hafnium aluminum oxide (HfAlO), or hafnium tantalum oxide (HfTaO), or the combination thereof, for example. A plurality of micro-lenses 118 may be arranged over the plurality of color filters 144. Respective micro-lenses 118 are aligned with the color filters 144 and overlie the sensing pixel 103. In some embodiments, the plurality of micro-lenses 118 have a substantially flat bottom surface abutting the plurality of color filters 144 and a curved upper surface. The curved upper surface is configured to focus the incident radiation or incident light 120 (e.g., light towards the underlying sensing pixel 103. During operation of the CMOS image sensor, the incident radiation or incident light 120 is focused by the micro-lens 118 to the underlying sensing pixel 103. When incident radiation or incident light of sufficient energy strikes the P-N junction photodiode 104, it generates an electron-hole pair that produces a photocurrent. Notably, though the micro-lenses 118 is shown as fixing onto the image sensor in FIG. 6A, it is appreciated that the image sensor may not include micro-lens, and the micro-lens may be attached to the image sensor later in a separate manufacture activity.

In some embodiments, a back-end-of-the-line (BEOL) metallization stack can be arranged on the front-side 122 of the substrate 102. The BEOL metallization stack comprises a plurality of metal interconnect layers arranged within one or more inter-level dielectric (ILD) layers 106. The ILD layers 106 may comprise one or more of a low-k dielectric layer (i.e., a dielectric with a dielectric constant less than about 3.9), an ultra low-k dielectric layer, or an oxide (e.g., silicon oxide). Conductive contacts 1602 are arranged within the ILD layers 106. The conductive contacts 1602 extend from the transfer gate electrode 116 and the floating diffusion well 142 to one or more metal wire layers 1604. In various embodiments, the conductive contacts 1602 may comprise a conductive metal such as copper or tungsten, for example. In some embodiments, a carrier substrate 146 is attached or bonded to the front-side of the substrate 102 through the ILD layers 106. The carrier substrate 146 can be a handling wafer, a ASIC circuit, other sensing circuit, or any applicable structures that support, assist or collectively function with the image sensor circuitry.

Figure 6B:
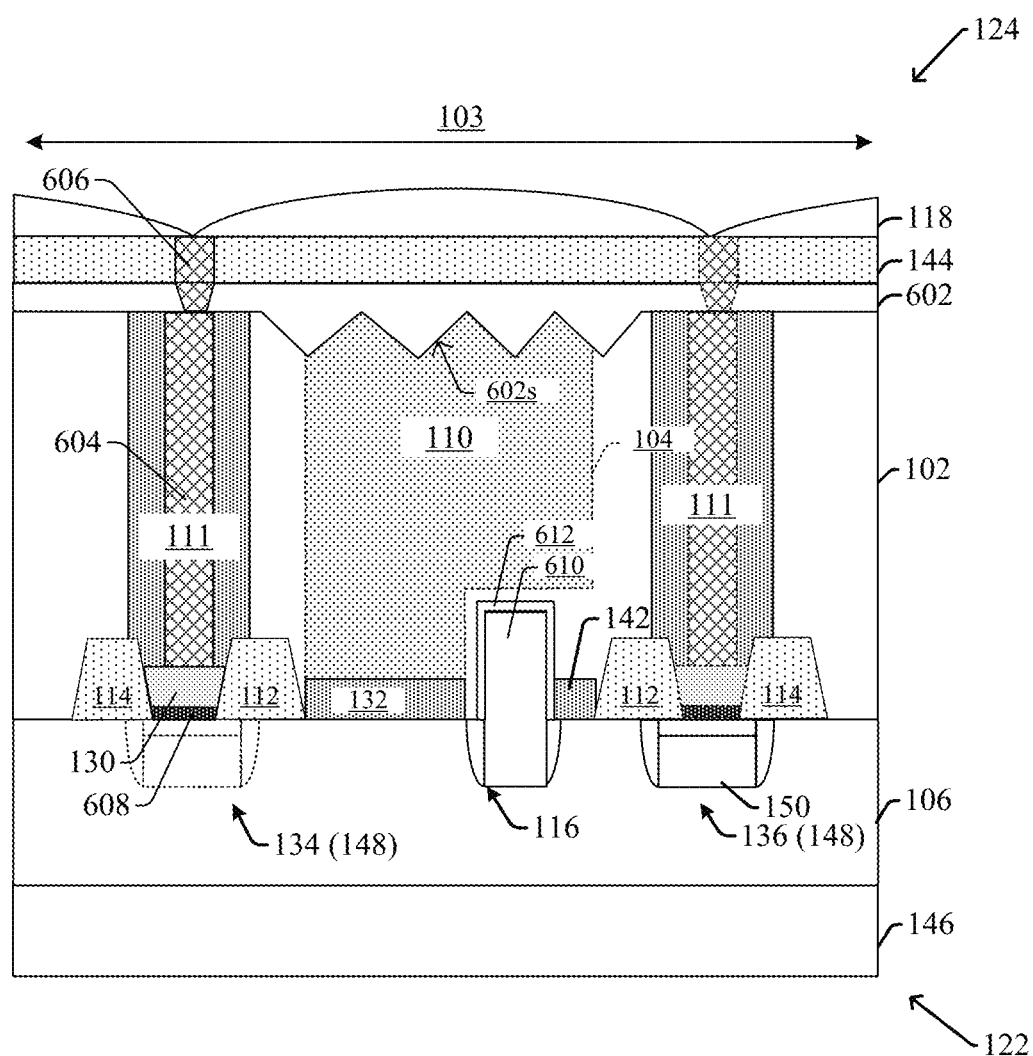
FIG. 6B illustrates a cross-sectional view of some additional embodiments of an integrated chip comprising an image sensor having a pixel device on a DTI structure.

FIG. 6B illustrates a cross-sectional view of some additional embodiments of a CMOS image sensor comprising a pixel device overlying a DTI structure 111. Besides similar features shown and described above for FIG. 6A, in some embodiments, as shown in FIG. 6B, the anti-reflection layer 602 may have a non-flat bottom surface close to the P-N junction photodiode doping column 110, such that the incident light can be better constrained to the pixel region. Thereby, the crosstalk between sensing pixels can be improved. In some other embodiments, a conductive column 604 can be disposed at a center region of the DTI structure 111. A back-side contact 606 can be disposed at the back-side 124 of the substrate 102 through the anti-reflection layer 602. The conductive column 604 can electrically connect the source/drain (S/D) regions 130 of the pixel device 148 to the back-side contact 606. Still in some other embodiments, the source/drain (S/D) regions 130 of the pixel device 148 may comprise a silicide layer 608 locating at an upper region of the source/drain (S/D) regions 130. Thus, a high frame rate can be realized due to low silicide S/D resistance and low parasitic capacitance. In some embodiments, the silicide layer 608 may comprise cobalt, nickel, platinum, tungsten, molybdenum, titanium, or the combination thereof. Still in some other embodiments, a transfer gate electrode 610 is arranged on the front-side 122 of the substrate 102 at a position laterally between the P-N junction photodiode 104 and the floating diffusion well 142 and separated from the substrate 102 by a gate dielectric 612. The transfer gate electrode 610 and the gate dielectric 612 extend to a position within the substrate 102. The transfer gate electrode 610 may be made of poly-silicon or metal. As an example, a vertical transfer depth h of the transfer gate electrode 610 can be in a range of from about 0.1 μm to about 0.6 μm. In some embodiments, the S/D regions 130 may have a thin channel thickness below the gate electrode 150 of the pixel device 148. For example, the channel thickness of the pixel device 148 may be in a range of from about 5 nm to about 50 nm. Thus, the channel region of the pixel device 148 can be fully depleted or at least partially depleted during the operation.

Figure 7:
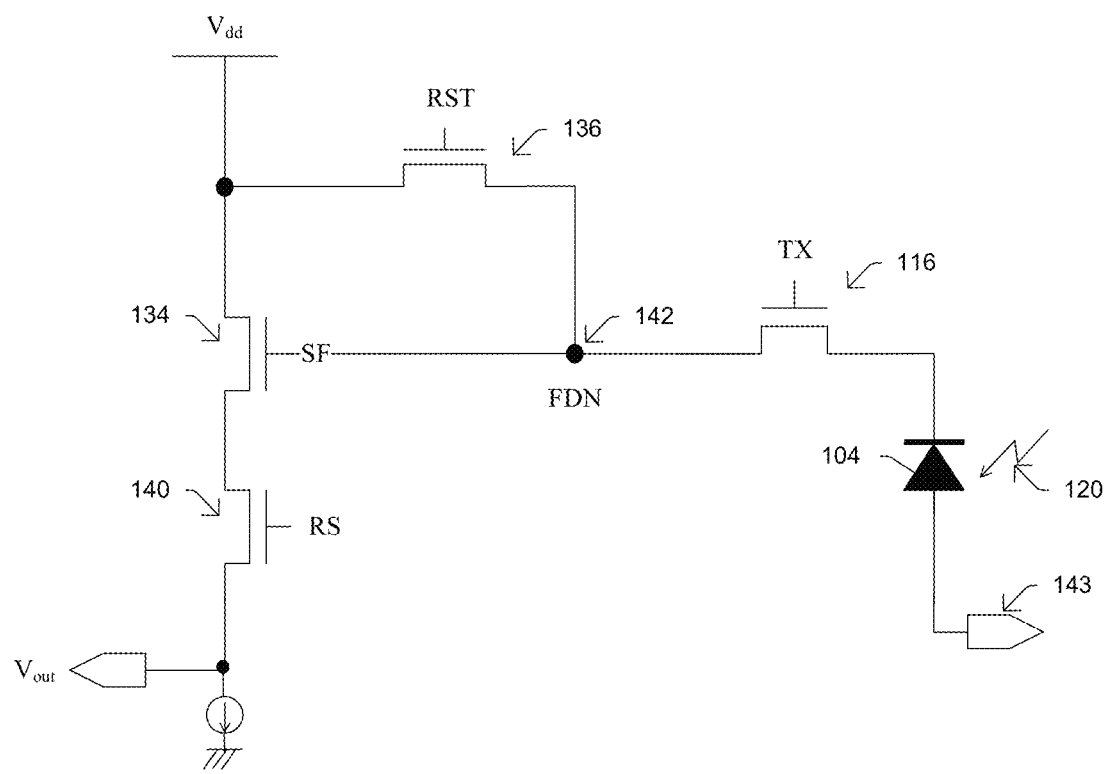
FIG. 7 illustrates a circuit diagram of some embodiments of a photosensors of an image sensor in accordance with some embodiments.

With reference to FIG. 7, a circuit diagram of some embodiments of a pixel sensor 700, such as a image sensor 100 of FIG. 1 or other embodiments of the image sensors described above, is provided. The pixel sensor 700 includes a P-N junction photodiode doping column 110, which can be implemented as P-N junction photodiode 104 with the substrate 102 or a doping well with the substrate 102. When incident light (containing photons of sufficient energy) strikes the P-N junction photodiode 104, an electron-hole pair is created. If absorption occurs in the junction's depletion region, or one diffusion length away from it, the carriers of this electron-hole pair are swept from the junction by the built-in electric field of the depletion region. Thus holes move toward an anode region of the P-N junction photodiode 104 and electrons toward a cathode region of the P-N junction photodiode 104, and a photocurrent is produced. The total current through the P-N junction photodiode 104 is the sum of the dark current (current that is generated in the absence of light) and the photocurrent. The P-N junction photodiode 104 is electrically connected to a floating diffusion well 142 by way of a transfer gate electrode 116. The other end of the P-N junction photodiode 104 may be connected to a photodiode surrounding well node 143. The transfer gate electrode 116 selectively transfers charge from the P-N junction photodiode 104 to the floating diffusion well 142. A reset transistor 136 is electrically connected between a DC voltage supply terminal Vdd and the floating diffusion well 142 to selectively clear charge at the floating diffusion well 142. A source follower transistor 134 is electrically connected between Vdd and an output Vout, and is gated by the floating diffusion well 142, to allow the charge level at the floating diffusion well 142 to be observed without removing the charge. A row select transistor 140 is electrically connected between the source follower transistor 134 and the output Vout to selectively output a voltage proportional to the charge at the floating diffusion well 142. A current source may be connected between the row select transistor 140 and the output Vout.

During use, the pixel sensor 700 is exposed to an optical image for a predetermined integration period. Over this period of time, the pixel sensor records the intensity of light incident on the P-N junction photodiode 104 by accumulating charge proportional to the light intensity. After the predetermined integration period, the amount of accumulated charge is read. In some embodiments the amount of accumulated charge for the P-N junction photodiode 104 is read by momentarily activating the reset transistor 136 to clear the charge stored at the floating diffusion well 142. Thereafter, the row select transistor 140 is activated and the accumulated charge of the P-N junction photodiode 104 is transferred to the floating diffusion well 142 by activating the transfer gate electrode 116 for a predetermined transfer period. During the predetermined transfer period, the voltage at the output Vout is monitored. As the charge is transferred, the voltage at the output Vout varies, typically decreasing. After the predetermined transfer period, the change in the voltage observed at the output Vout is proportional to the intensity of light recorded at the P-N junction photodiode 104.

FIGS. 8-20 illustrate some embodiments of top views and/or cross-sectional views showing a method of forming a CMOS image sensor having a pixel device on a deep trench isolation (DTI) structure.

Figure 8:
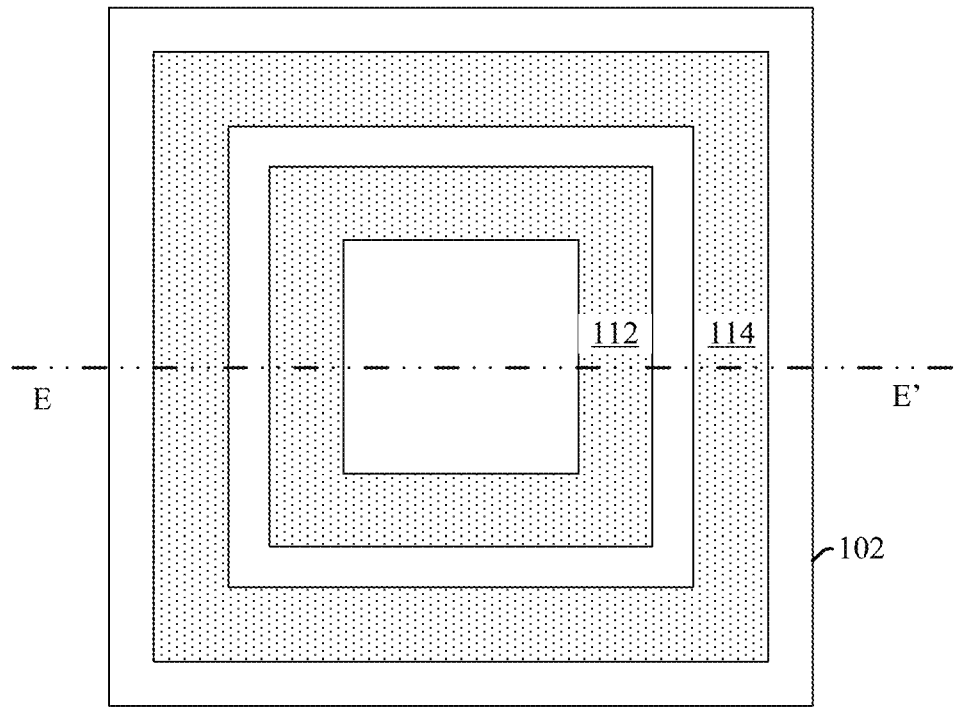
FIGS. 8-20 illustrate some embodiments of cross-sectional views and/or top views showing a method of forming a CMOS image sensor having a pixel device on a DTI structure.
Figure 9:
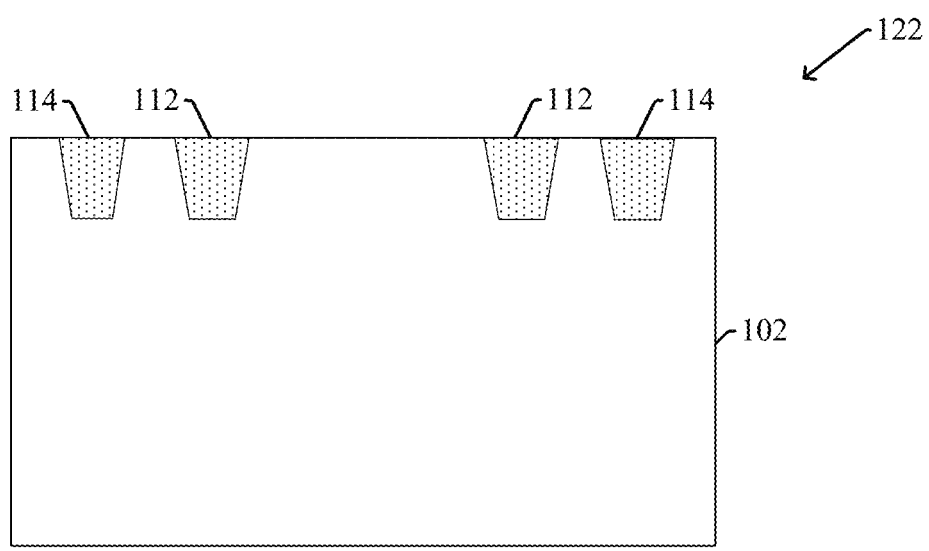

As shown in top view 800 of FIG. 8 and cross-sectional view 900 of FIG. 9, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 102 may be prepared including forming an epitaxial layer having a first doping type (e.g. p-type) doping concentration in a range of from about $10^{13}/cm^3$ to about $10^{15}/cm^3$. A doping well with the first doping type (e.g. p-type) with a doping concentration in a range of from about $10^{14}/cm^3$ to about $10^{18}/cm^3$ may be formed within the epitaxial layer as a first region of a P-N junction photodiode to be formed. Then, a first shallow trench isolation (STI) structure 112 and a second STI structure 114 are formed from a front-side 122 of a substrate 102. The first STI structure 112 and the second STI structure 114 may be formed by performing an etching process to form a first shallow trench ring and a second shallow trench ring separated from one another at a peripheral region of a sensing pixel of the CMOS image sensor. Then a dielectric layer is filled into the first shallow trench ring and the second shallow trench ring and over the substrate 102, followed by an etching back process to etch and expose a top surface of the substrate 102.

Figure 10:
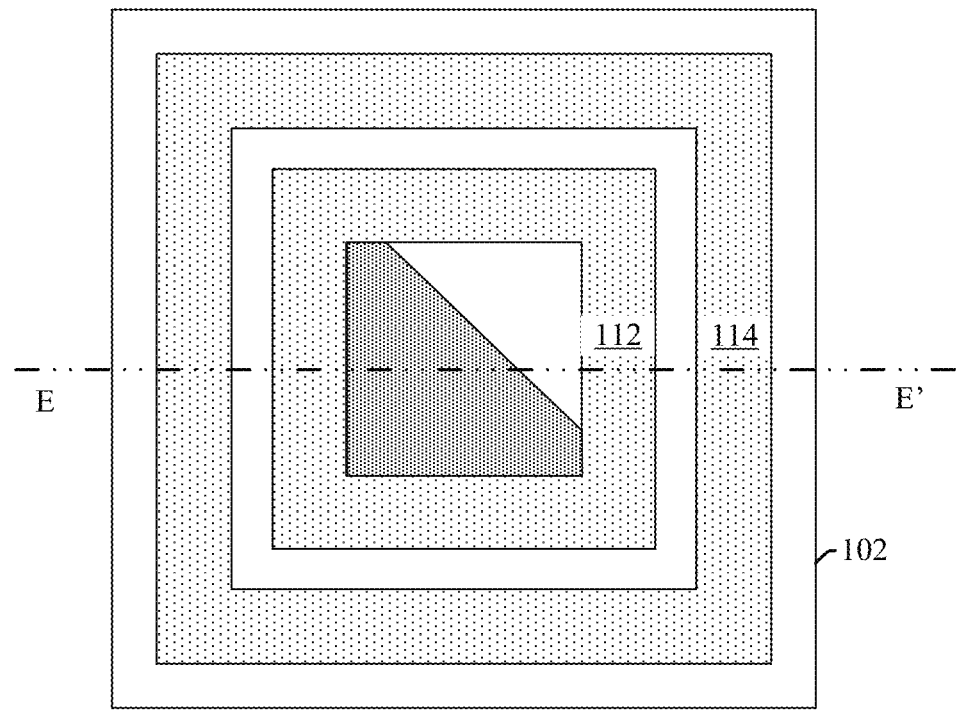
Figure 11:
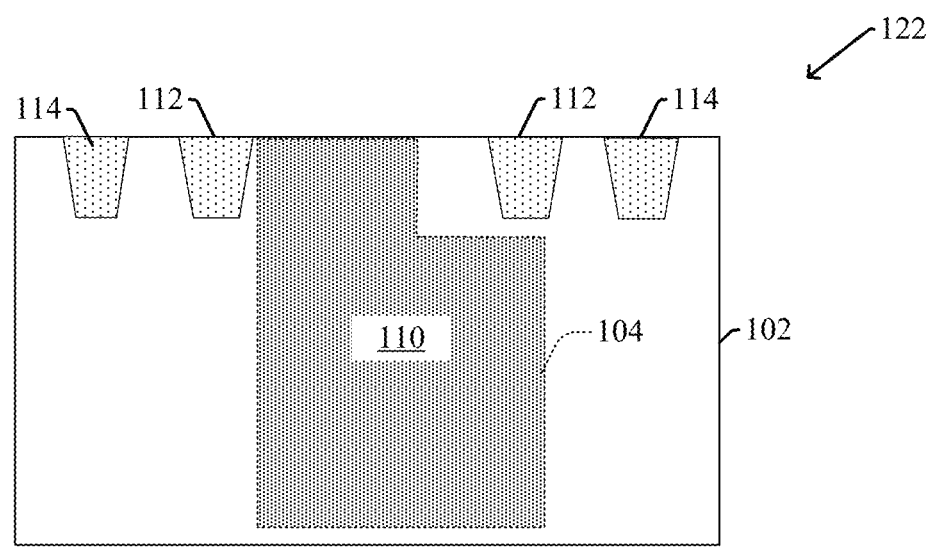

As shown in top view 1000 of FIG. 10 and cross-sectional view 1100 of FIG. 11, a first dopant is implanted into the substrate 102 to form doped region including a P-N junction photodiode doping column 110 within the front-side 122 of the substrate 102 in the center region of the first STI structure 112 and the second STI structure 114. In some embodiments, the first dopant may comprise the second doping type (e.g. an n-type dopant such as phosphorus) that is implanted into the front-side 122 of the substrate 102. The P-N junction photodiode doping column 110 contacts the substrate 102 or the doping well of the substrate 102 to form a P-N junction photodiode 104.

Figure 12:
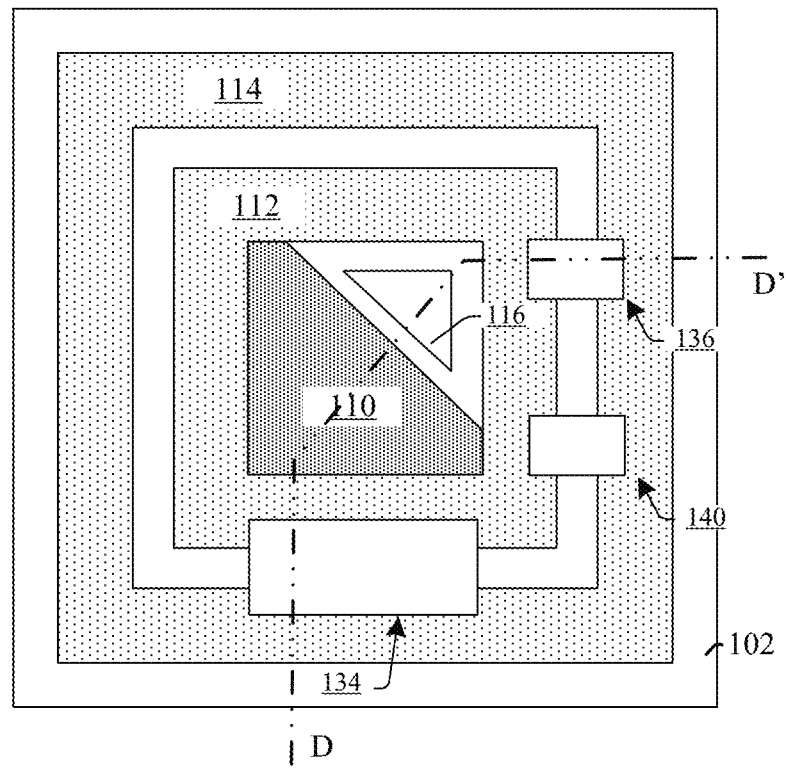
Figure 13:
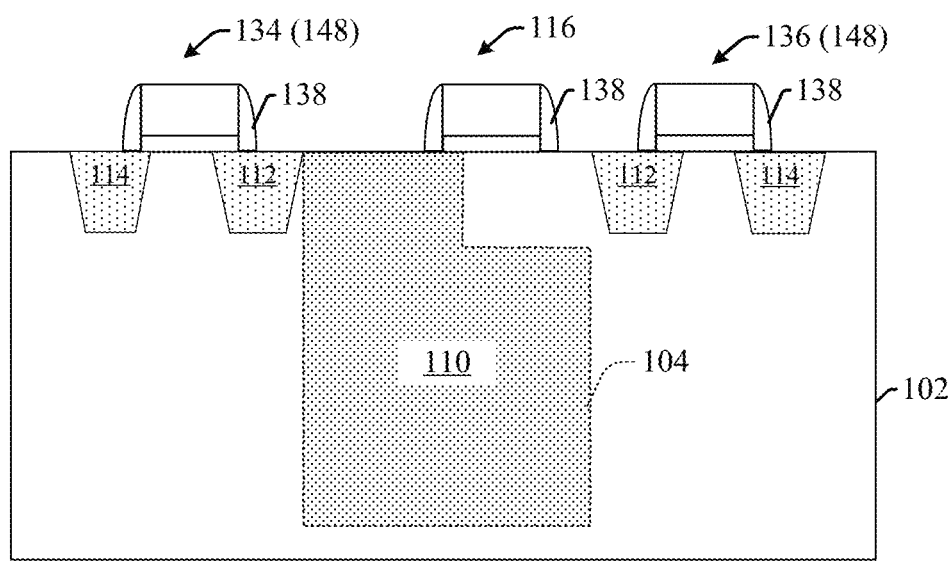

As shown in top view 1200 of FIG. 12 and cross-sectional view 1300 of FIG. 13, a transfer gate electrode 116 and gate structures for pixel devices 148 such as a source follower transistor 134, a reset transistor 136, and/or a row select transistor 140 are formed over the front-side 122 of the substrate 102. The gate structures may be formed by depositing a gate dielectric film and a gate electrode film over the substrate 102. The gate dielectric film and the gate electrode film are subsequently patterned to form a gate dielectric layer and a gate electrode. Sidewall spacers 138 may be formed on the outer sidewalls of the gate electrode. In some embodiments, the sidewall spacers 138 may be formed by depositing nitride onto the front-side 122 of the substrate 102 and selectively etching the nitride to form the sidewall spacers 138. The gate structures for pixel devices 148 are formed between the first STI structure 112 and the second STI structure 114.

Figure 14:
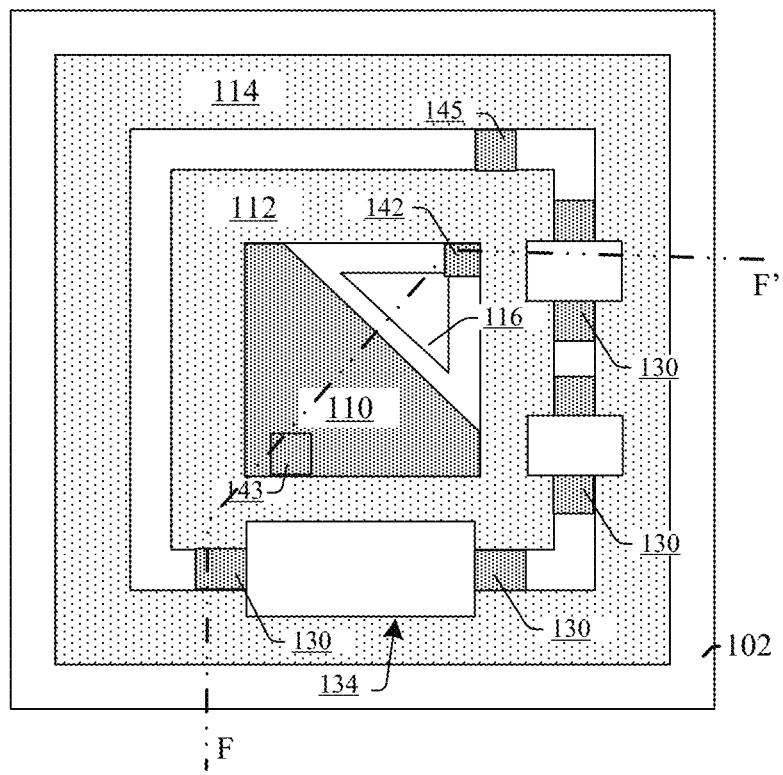
Figure 15:
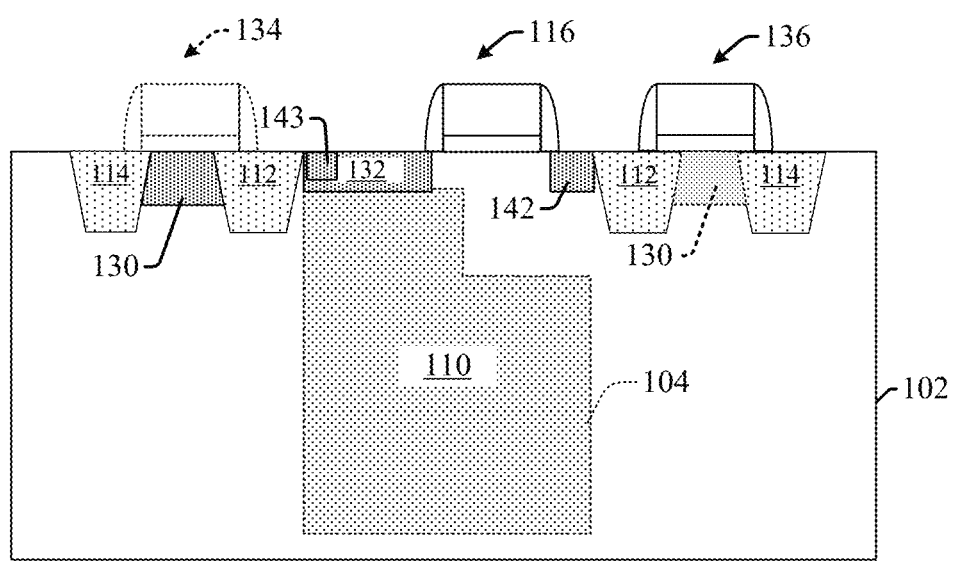

As shown in top view 1400 of FIG. 14 and cross-sectional view 1500 of FIG. 15, a plurality of implantation process is performed. Implantation processes are performed within the front-side 122 of the substrate 102 to form a floating diffusion well 142 along one side of the transfer gate electrode 116. S/D regions 130 are formed alongside the gate structures for pixel devices 148 such as the source follower transistor 134, the reset transistor 136, and/or the row select transistor 140. In some embodiments, a second dopant may be implanted using a patterned mask to form a pinning doped layer 132 extending into a first depth of the substrate 102 from the front-side 122. The second dopant specie may comprise the first doping type (e.g. a p-type dopant such as boron). The pinning doped layer 132 may have a greater doping concentration than the doping well. An example doping concentration of the pinning doped layer 132 can be in a range of from about $10^{16}/cm^3$ to about $10^{18}/cm^3$. An example doping concentration of the floating diffusion well 142 and the S/D regions 130 can be in a range of from about $10^{18}/cm^3$ to about $10^{21}/cm^3$. In some embodiments, the substrate 102 may be selectively implanted according to a patterned masking layer (not shown) comprising photoresist.

Figure 16:
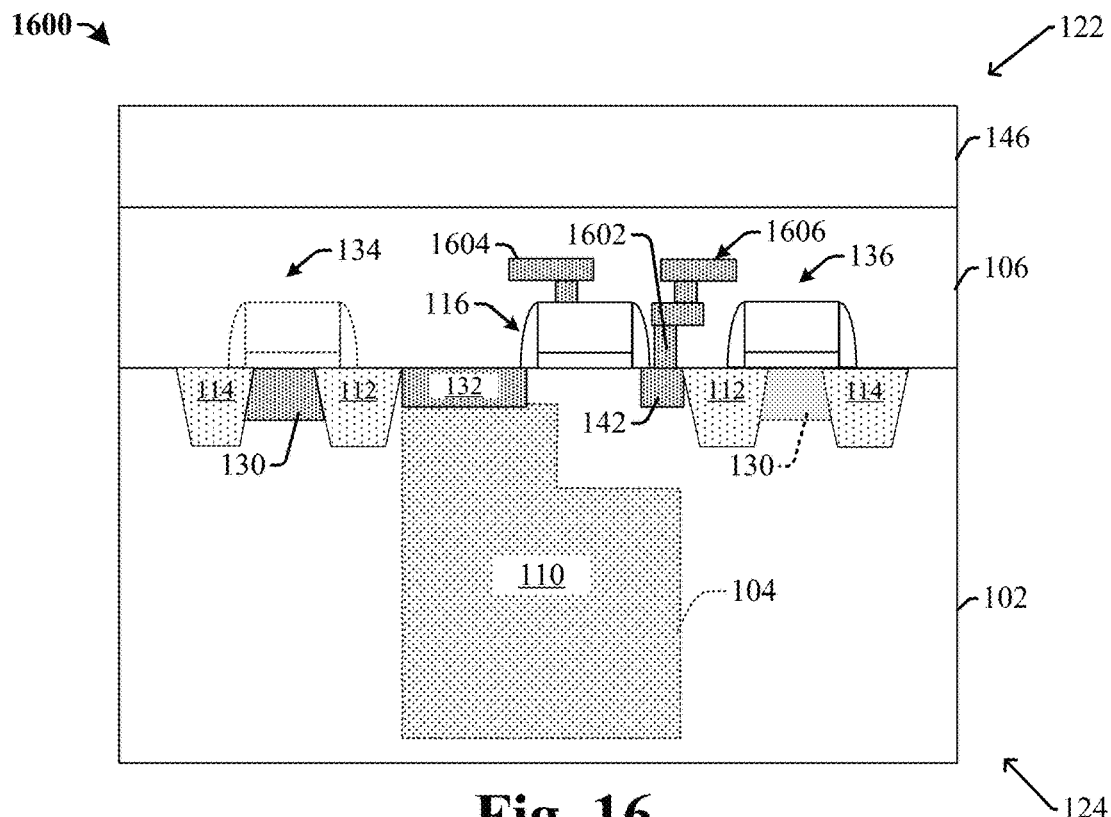

As shown in cross-sectional view 1600 of FIG. 16, a BEOL metallization stack 1606 comprising a plurality of metal interconnect layers arranged within an ILD layer 106 can be formed over the front-side 122 of the substrate 102. In some embodiments, the BEOL metallization stack 1606 may be formed by forming the ILD layer 106, which comprises one or more layers of ILD material, over the front-side 122 of the substrate 102. The ILD layer 106 is subsequently etched to form via holes and/or metal trenches. The via holes and/or metal trenches are then filled with a conductive material to form the plurality of metal interconnect layers. In some embodiments, the ILD layer may be deposited by a physical vapor deposition technique (e.g., PVD, CVD, etc.). The plurality of metal interconnect layers may be formed using a deposition process and/or a plating process (e.g., electroplating, electro-less plating, etc.). In various embodiments, the plurality of metal interconnect layers may comprise tungsten, copper, or aluminum copper, for example. The ILD layer can be then bonded to a handle substrate (not shown) or any other functional substrate for stacked structure. In some embodiments, the bonding process may use an intermediate bonding oxide layer arranged between the ILD layer and the handle substrate. In some embodiments, the bonding process may comprise a fusion bonding process.

Figure 17:
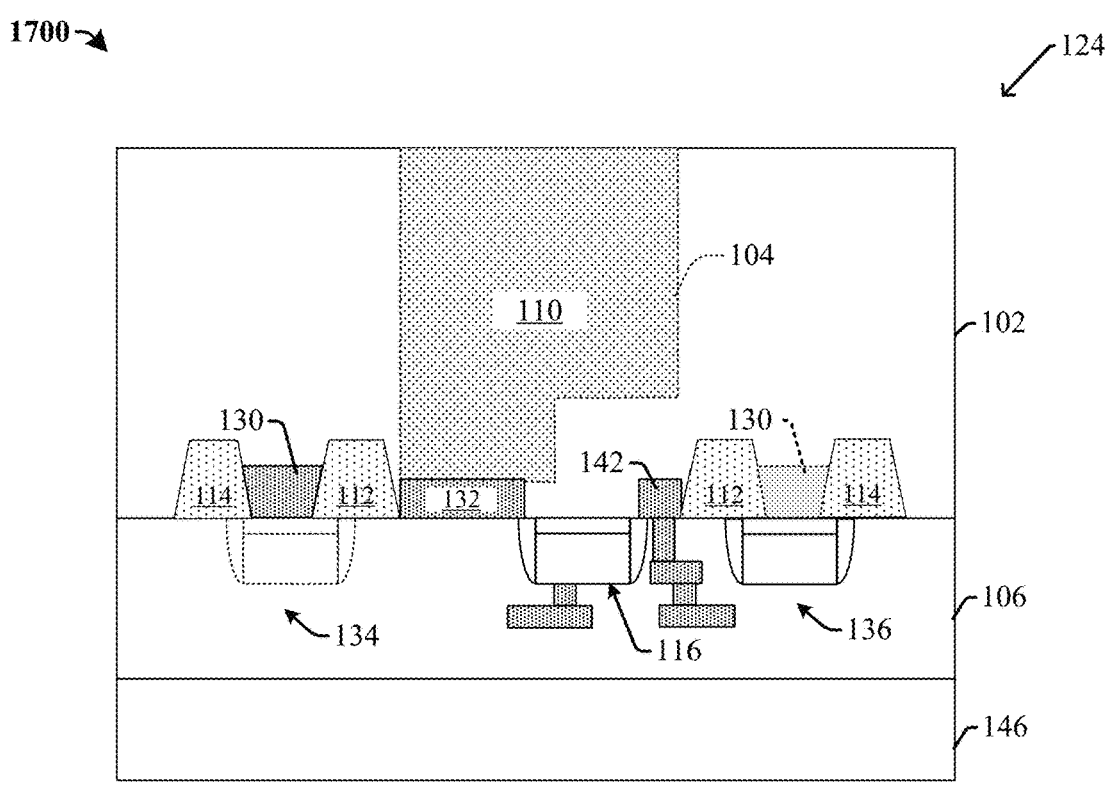

As shown in cross-sectional view 1700 of FIG. 17, the substrate 102 is flipped over for further processing on a back-side 124 that is opposite to the front-side 122. The substrate 102 is thinned down and a back-side of the P-N junction photodiode doping column 110 may be exposed. As an example, the thinned substrate 102 may have a thickness in a range of from about 2 µm to about 10 µm. In some embodiments, the substrate 102 may be thinned by etching the back-side 124 of the semiconductor substrate. In other embodiments, the substrate 102 may be thinned by mechanical grinding the back-side 124 of the semiconductor substrate.

Figure 18:
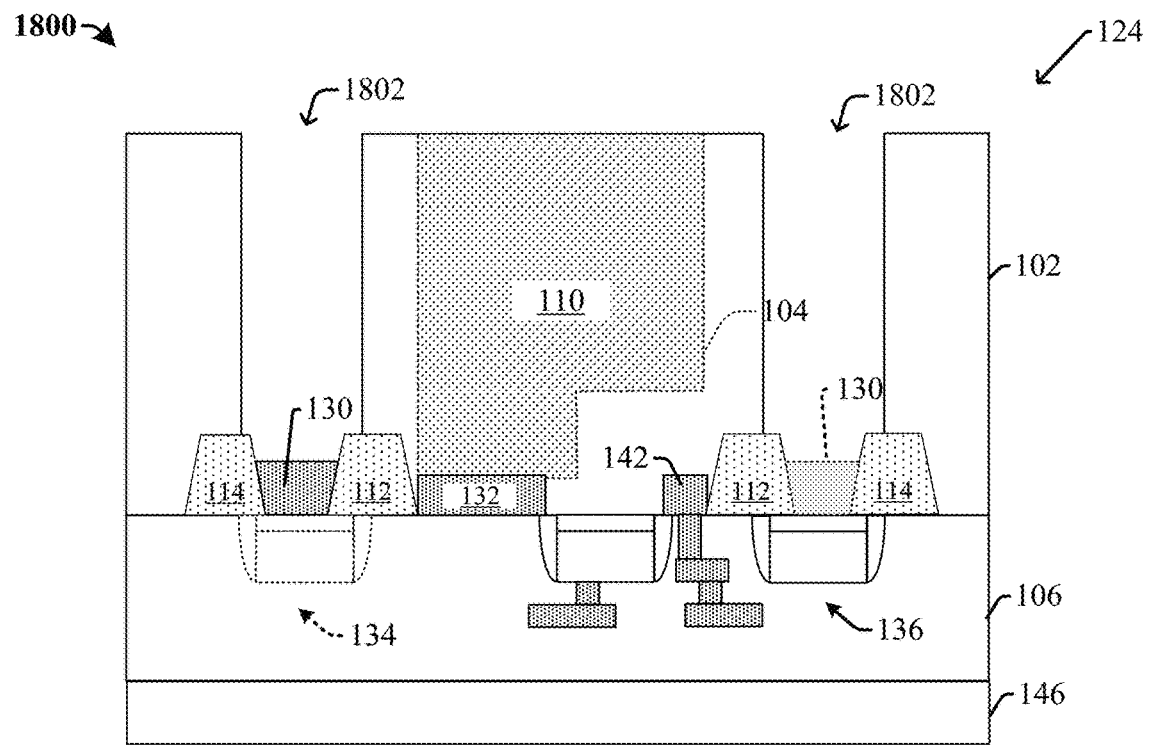

As shown in cross-sectional view 1800 of FIG. 18, the substrate 102 is selectively etched to form deep trenches 1802 within the back-side 124 of the substrate 102. In some embodiments, the substrate 102 may be etched by forming a masking layer onto the back-side 124 of the substrate 102. The substrate 102 is then exposed to an etchant in regions not covered by the masking layer. The etchant etches the substrate 102 to form deep trenches 1802 extending to a position reaching and/or passing a bottom surfaces of the first STI structure 112 and the second STI structure 114. The deep trenches 1802 may be formed to expose the S/D regions 130 of the pixel devices 148 such as a source follower transistor 134, a reset transistor 136, and/or a row select transistor 140 from the back-side 124 of the substrate 102. In various embodiments, the masking layer may comprise photoresist or a nitride (e.g., SiN) patterned using a photolithography process. In various embodiments, the etchant may comprise a dry etchant having an etching chemistry comprising a fluorine species (e.g., $CF_4$, $CHF_3$, $C_4F_8$, etc.) or a wet etchant (e.g., hydroflouric acid (HF) or Tetramethylammonium hydroxide (TMAH)). The deep trenches 1802 may laterally extend to an outer sidewall of the first STI structure 112 and an inner sidewall of the second STI structure 114 but not extend to an inner sidewall of the first STI structure 112 and an outer sidewall of the second STI structure 114.

Figure 19:
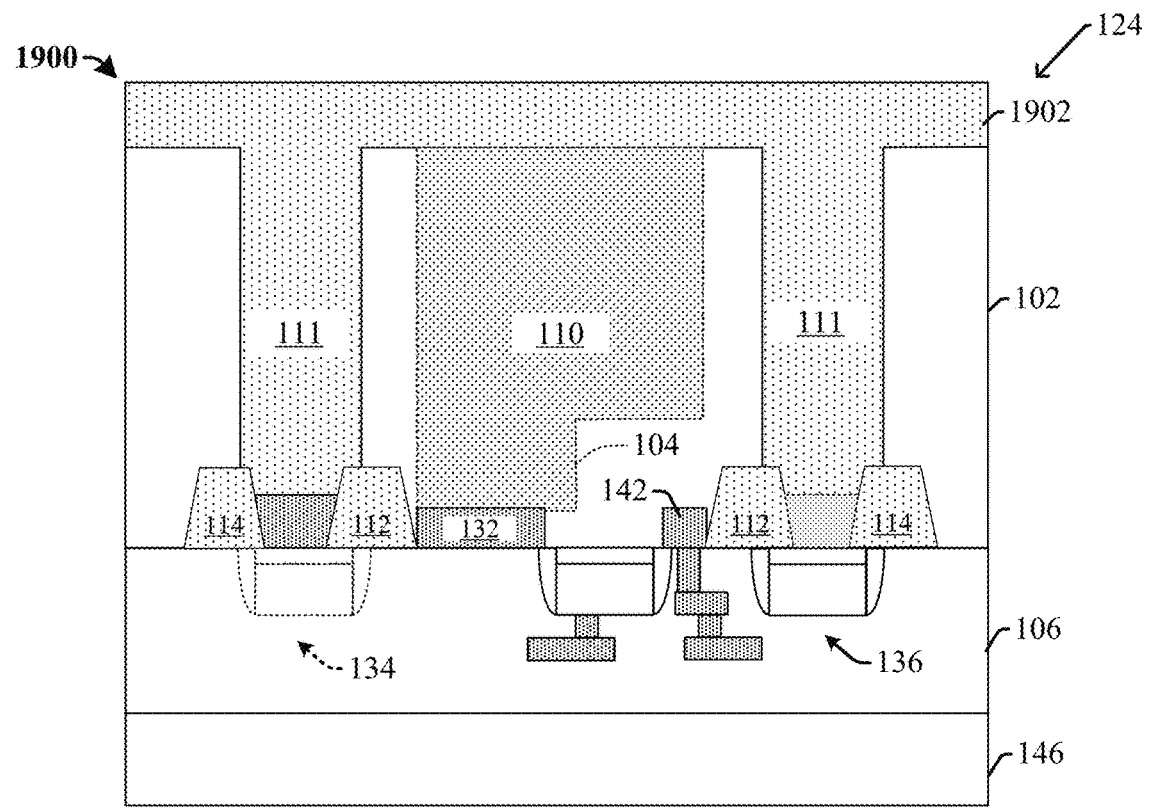

As shown in cross-sectional view 1900 of FIG. 19, a dielectric fill layer 1902 is formed to fill the deep trenches 1802. Though not shown by FIG. 19, in some embodiments, a planarization process is performed after forming the dielectric fill layer 1902 to form a planar surface and discrete DTI structure 111. As a result, the DTI structure 111 is formed in the substrate 102, extending from the back-side 124 to a position within the substrate 102 and may contact first STI structure 112 and the second STI structure 114, and/or the S/D regions 130 of the pixel devices 148.

Figure 20:
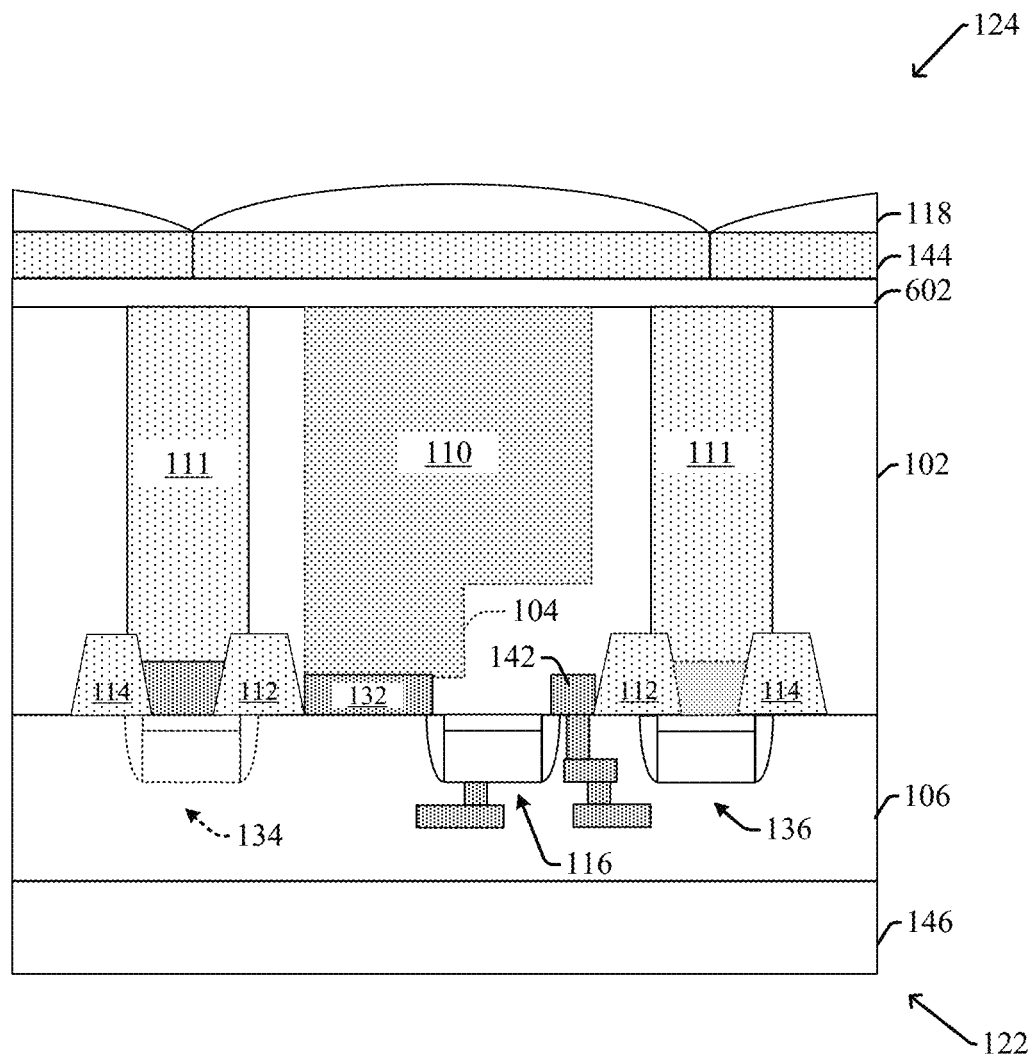

As shown in cross-sectional view 2000 of FIG. 20, a plurality of color filters 144 can be subsequently formed over the back-side 124 of the substrate 102. An anti-reflection layer 602 may be formed between the color filters 144 and the substrate 102. In some embodiments, the plurality of color filters 144 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation. A plurality of micro-lenses 118 may be formed over the plurality of color filters. In some embodiments, the plurality of micro-lenses may be formed by depositing a micro-lens material above the plurality of color filters (e.g., by a spin-on method or a deposition process). A micro-lens template having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses are then formed by selectively etching the micro-lens material according to the micro-lens template.

Figure 21:
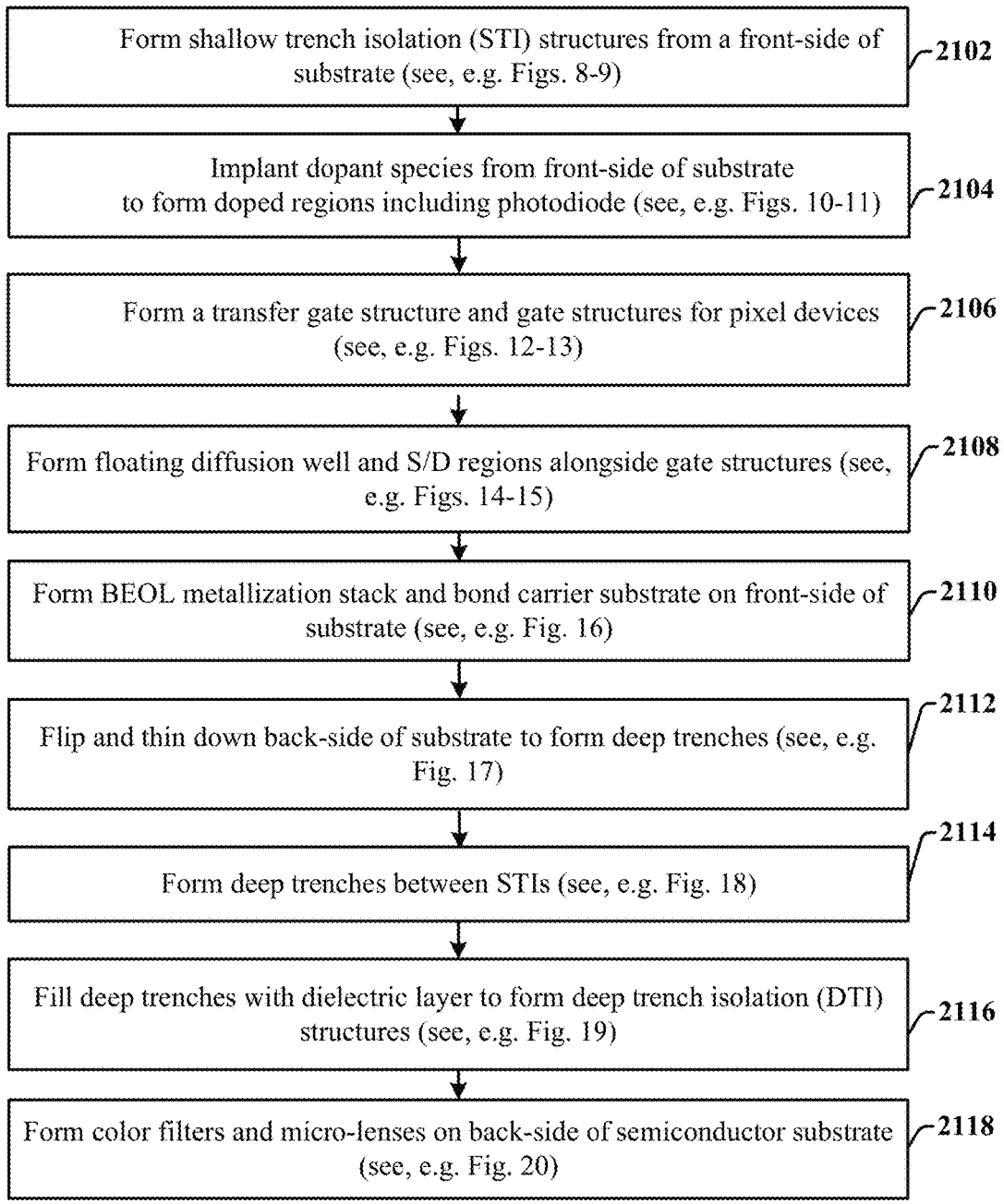
FIG. 21 illustrates a flow diagram of some embodiments of a method of forming a CMOS image sensor having a pixel device on a DTI structure.

FIG. 21 illustrates a flow diagram of some embodiments of a method 2100 of forming a CMOS image sensor having a pixel device on a deep trench isolation (DTI) structure.

While disclosed method 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At act 2102, a substrate 102 is provided. A doping well with the first doping type (e.g. p-type) may be formed within the epitaxial layer as a first region of a P-N junction photodiode to be formed. Then, a first shallow trench isolation (STI) structure and a second STI structure are formed from a front-side of a substrate. FIGS. 8-9 illustrate a cross-sectional view and a top view corresponding to some embodiments corresponding to act 2102.

At act 2104, a first dopant is implanted into the substrate to form doped region including a P-N junction photodiode doping column within the front-side of the substrate in the center region of the first STI structure and the second STI structure. FIGS. 10-11 illustrate a cross-sectional view and a top view corresponding to some embodiments corresponding to act 2104.

At act 2106, a transfer gate electrode and gate structures for pixel devices such as a source follower transistor, a reset transistor, and/or a row select transistor are formed over the front-side of the substrate. The gate structures for pixel devices are formed between the first STI structure 112 and the second STI structure 114. The gate structures may be formed by depositing a gate dielectric film and a gate electrode film over the substrate. The gate dielectric film and the gate electrode film are subsequently patterned to form a gate dielectric layer and a gate electrode. Sidewall spacers may be formed on the outer sidewalls of the gate electrode. FIGS. 12-13 illustrate a cross-sectional view and a top view corresponding to some embodiments corresponding to act 2106.

At act 2108, a plurality of implantation process is performed. Implantation processes are performed within the front-side of the substrate to form a floating diffusion well along one side of the transfer gate electrode. S/D regions are formed alongside the gate structures for pixel devices. In some embodiments, a second dopant may be implanted as a blanket implantation (i.e., an unmasked implantation) to form a pinning doped layer extending into a first depth of the substrate from the front-side. FIGS. 14-15 illustrate a cross-sectional view and a top view corresponding to some embodiments corresponding to act 2108.

At act 2110, a BEOL metallization stack comprising a plurality of metal interconnect layers arranged within an ILD layer can be formed over the front-side of the substrate. FIG. 16 illustrates a cross-sectional view corresponding to some embodiments corresponding to act 2110.

At act 2112, the substrate is flipped over for further processing on a back-side that is opposite to the front-side. The substrate is thinned down and a back-side of the P-N junction photodiode doping column may be exposed. FIG. 17 illustrates a cross-sectional view corresponding to some embodiments corresponding to act 2112.

At act 2114, the substrate 102 is selectively etched to form deep trenches within the back-side of the substrate. The etchant etches the substrate to form deep trenches extending to a position reaching and/or passing bottom surfaces of the first STI structure and the second STI structure. The deep trenches may be formed to expose the S/D regions of the pixel devices. The deep trenches may laterally extend to inner sidewalls of the first STI structure and the second STI structure and not extend to outer sidewalls of the first STI structure and the second STI structure. FIG. 18 illustrates a cross-sectional view corresponding to some embodiments corresponding to act 2114.

At act 2116, a dielectric fill layer is formed to fill the deep trenches. In some embodiments, a planarization process is performed after forming the dielectric fill layer to form a planar surface and discrete DTI structure. As a result, the DTI structures formed in the substrate, extending from the back-side to a position within the substrate and may contact first STI structure and the second STI structure, and/or the S/D regions of the pixel devices. FIG. 19 illustrates a cross-sectional view corresponding to some embodiments corresponding to act 2116.

At act 2118, color filters and micro-lenses are formed over the back-side of the semiconductor substrate. FIG. 20 illustrates a cross-sectional view corresponding to some embodiments corresponding to act 2118.

Therefore, the present disclosure relates to a CMOS image sensor having a pixel device on a deep trench isolation (DTI) structure, and an associated method of formation. The DTI structure comprises a doped layer doped layer lining a sidewall surface of a deep trench and a dielectric layer filling a remaining space of the deep trench. By forming the disclosed pixel device directly overlying the DTI structure, short channel effect is reduced because of the room for pixel device and also because the insulation layer underneath the pixel device. Thus higher device performance can be realized, and the blooming and crosstalk are reduced.

In some embodiments, the present disclosure relates to a CMOS image sensor. The image sensor comprises a substrate having a front-side and a back-side opposite to the front-side. A pixel region is disposed within the substrate and respectively comprising a P-N junction photodiode configured to convert radiation that enters the substrate from the back-side into an electrical signal. A deep trench isolation (DTI) structure is disposed at a peripheral of the pixel region, extending from the back-side of the substrate to a position within the substrate. A pixel device is disposed at the front-side of the substrate directly overlying the DTI structure. The pixel device comprises a gate electrode disposed over the substrate and a pair of source/drain (S/D) regions disposed within the substrate and reaching on a top surface of the DTI structure.

In some alternative embodiments, the present disclosure relates to a CMOS image sensor. The image sensor comprises a substrate having a front-side and a back-side opposite to the front-side. A pixel region is disposed within the substrate and comprises a P-N junction photodiode configured to convert radiation that enters the substrate from the back-side into an electrical signal. A first shallow trench isolation (STI) structure and a second STI structure extend from the front-side of the substrate surrounding the P-N junction photodiode. A deep trench isolation (DTI) structure is disposed between the first and second STI structures and extending from the back-side of the substrate to meet the first and second STI structures within the substrate. A pixel device is disposed at the front-side of the substrate between the first and second STI structures, the pixel device comprising a gate electrode disposed over the substrate and a pair of source/drain (S/D) regions disposed within the substrate.

In yet other embodiments, the present disclosure relates to method of forming an image sensor. The method comprises forming a first shallow trench isolation (STI) structure and a second STI structure at a peripheral of a pixel region from a font-side of a substrate and forming doping layers corresponding to a P-N junction photodiode of a pixel region from the front-side of a substrate. The method further comprises forming a transfer gate structure aside of the P-N junction photodiode and a floating diffusion well at one side of the transfer gate opposite to the P-N junction photodiode and forming a gate structure for a pixel device between the first STI structure and a second STI structure and S/D regions alongside the gate structure of the pixel device. The method further comprises forming a deep trench from a back-side of the substrate extending into the substrate and between the first STI structure and the second STI structure and filling the deep trench with a dielectric layer to form a deep trench isolation (DTI) structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A CMOS image sensor, comprising:
 a substrate having a front-side and a back-side opposite to the front-side;
 a pixel region disposed within the substrate and comprising a P-N junction photodiode configured to convert radiation that enters the substrate from the back-side into an electrical signal;
 a first trench isolation structure disposed at a peripheral of the pixel region, extending from the back-side of the substrate to a position within the substrate; and
 a pixel device disposed at the front-side of the substrate directly overlying the first trench isolation structure, the pixel device comprising a gate electrode disposed over the substrate and a pair of source/drain (S/D) regions disposed within the substrate and reaching on a top surface of the first trench isolation structure;
 wherein the pixel device is a source follower transistor, a reset transistor, or a row select transistor.

2. The CMOS image sensor of claim 1, further comprising:
 a second trench isolation structure disposed from the front-side at an inner peripheral of the first trench isolation structure and a third trench isolation structure disposed from the front-side at an outer peripheral of the first trench isolation structure;
 wherein the pixel device is disposed between the second trench isolation structure and the third trench isolation structure.

3. The CMOS image sensor of claim 2, wherein the S/D regions of the pixel device have bottom surfaces locating at a position of the substrate higher than bottom surfaces of the second trench isolation structure and the third trench isolation structure.

4. The CMOS image sensor of claim 2, wherein the S/D regions of the pixel device have bottom surfaces laterally aligned with bottom surfaces of the second trench isolation structure and the third trench isolation structure.

5. The CMOS image sensor of claim 2, wherein the first trench isolation structure has an outermost sidewall contacting a bottom surface of the second trench isolation structure and an innermost sidewall contacting a bottom surface of the third trench isolation structure.

6. The CMOS image sensor of claim 2, wherein the first trench isolation structure has a top surfaces locating at a position of the substrate vertically exceeding bottom surfaces of the second trench isolation structure and the third trench isolation structure.

7. The CMOS image sensor of claim 2, wherein the pixel device has outermost sidewalls of the S/D regions contacting an outermost sidewall of the second trench isolation structure and innermost sidewalls of the S/D regions contacting innermost sidewall of the third trench isolation structure.

8. The CMOS image sensor of claim 1, wherein the first trench isolation structure comprises silicon oxide.

9. The CMOS image sensor of claim 1, further comprising:
an anti-reflection layer disposed on the back-side of the substrate;
wherein the anti-reflection layer has a non-flat bottom surface.

10. The CMOS image sensor of claim 9, further comprising:
a conductive column disposed at a center region of the first trench isolation structure and electrically connecting the source/drain (S/D) regions of the pixel device to a contact at the back-side of the substrate through the anti-reflection layer.

11. The CMOS image sensor of claim 1, wherein the source/drain (S/D) regions of the pixel device comprise a silicide layer locating at an upper region of the source/drain (S/D) regions.

12. The CMOS image sensor of claim 1, further comprising:
a floating diffusion well disposed within the substrate between the P-N junction photodiode and the first trench isolation structure; and
a transfer gate electrode arranged on the front-side of the substrate at a position laterally between the P-N junction photodiode and the floating diffusion well and separated from the substrate by a gate dielectric.

13. The CMOS image sensor of claim 12, wherein the transfer gate electrode and the gate dielectric extend to a position within the substrate.

14. A CMOS image sensor, comprising:
a substrate having a front-side and a back-side opposite to the front-side;
a pixel region disposed within the substrate and comprising a P-N junction photodiode configured to convert radiation that enters the substrate from the back-side into an electrical signal;
a first shallow trench isolation (STI) structure and a second STI structure extending from the front-side of the substrate surrounding the P-N junction photodiode;
a deep trench isolation (DTI) structure disposed between the first STI structure and the second STI structure and extending from the back-side of the substrate to meet the first STI structure and the second STI structure within the substrate; and
a pixel device disposed at the front-side of the substrate between the first and second STI structures, the pixel device comprising a gate electrode disposed over the substrate and a pair of source/drain (S/D) regions disposed within the substrate;
wherein the pixel device is a source follower transistor, a reset transistor, or a row select transistor.

15. The CMOS image sensor of claim 14, wherein the pixel device directly contacts a top surface of the DTI structure.

16. The CMOS image sensor of claim 14, wherein S/D regions of the pixel device separate from sidewalls of the first and second STI structures by the substrate.

17. The CMOS image sensor of claim 14, wherein a bisecting line of the first STI structure and the second STI structures laterally bisects the DTI structure.

18. The CMOS image sensor of claim 14, wherein the DTI structure has a top surfaces locating at a position of the substrate vertically exceeding bottom surfaces of the first STI structure and the second STI structure.

19. A CMOS image sensor, comprising:
a first shallow trench isolation (STI) structure and a second STI structure disposed at a peripheral of a pixel region from a front-side of a substrate;
a P-N junction photodiode disposed in the pixel region from the front-side of a substrate;
a transfer gate structure disposed aside of the P-N junction photodiode and a floating diffusion well disposed at one side of the transfer gate structure opposite to the P-N junction photodiode;
a gate structure for a pixel device disposed between the first STI structure and a second STI structure and S/D regions alongside the gate structure of the pixel device; and
a deep trench isolation structure disposed from a back-side of the substrate extending into the substrate and between the first STI structure and the second STI structures;
wherein the pixel device is a source follower transistor, a reset transistor, or a row select transistor.

20. The CMOS image sensor of claim 19, wherein the deep trench isolation structure directly contacts the S/D regions of the pixel device.

* * * * *